(12) United States Patent
Schelling et al.

(10) Patent No.: US 9,082,882 B2
(45) Date of Patent: Jul. 14, 2015

(54) MICROELECTRONIC COMPONENT AND CORRESPONDING PRODUCTION PROCESS

(71) Applicant: Robert Bosch GmbH, Stuttgart (DE)

(72) Inventors: Christoph Schelling, Stuttgart (DE); Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/032,649

(22) Filed: Sep. 20, 2013

(65) Prior Publication Data

US 2014/0084349 A1 Mar. 27, 2014

(30) Foreign Application Priority Data

Sep. 24, 2012 (DE) .......................... 10 2012 217 133

(51) Int. Cl.
| | |
|---|---|
| *H01L 29/84* | (2006.01) |
| *H01L 21/306* | (2006.01) |
| *B81B 3/00* | (2006.01) |
| *H01L 29/66* | (2006.01) |
| *B81C 1/00* | (2006.01) |
| *G01P 15/12* | (2006.01) |

(52) U.S. Cl.
CPC ............ *H01L 29/84* (2013.01); *B81C 1/00182* (2013.01); *G01P 15/124* (2013.01); *H01L 29/66477* (2013.01); *B81B 2201/025* (2013.01)

(58) Field of Classification Search
CPC ............... B81B 2201/0235; B81B 2201/0242; B81B 2201/025; B81B 2201/0228; B81B 2201/016; B81B 2201/018; B81B 7/00; B81B 7/0003; B81B 7/0006; B81C 2203/0714; B81C 2203/0728; B81C 2203/0735

USPC .......... 257/254, 415, E29.324; 438/50, 52, 53
See application file for complete search history.

(56) References Cited

U.S. PATENT DOCUMENTS

| | | | |
|---|---|---|---|
| 8,502,279 B2 * | 8/2013 | Toh et al. ....................... 257/254 |
| 8,692,337 B2 * | 4/2014 | Berthelot et al. ............. 257/415 |
| 2009/0134459 A1 * | 5/2009 | Goto et al. ..................... 257/347 |
| 2009/0317930 A1 | 12/2009 | Charvet |
| 2011/0023632 A1 * | 2/2011 | Bhat et al. ................. 73/862.626 |
| 2011/0057236 A1 * | 3/2011 | Feyh ............................. 257/254 |
| 2011/0095267 A1 * | 4/2011 | Bryant et al. .................... 257/24 |
| 2011/0265574 A1 | 11/2011 | Yang |
| 2013/0043547 A1 * | 2/2013 | Chu et al. ...................... 257/415 |

FOREIGN PATENT DOCUMENTS

| | | |
|---|---|---|
| DE | 10 2009 029 217 A1 | 3/2011 |
| EP | 0 990 911 A1 | 4/2000 |

\* cited by examiner

*Primary Examiner* — Marvin Payen
*Assistant Examiner* — Jermey Joy
(74) *Attorney, Agent, or Firm* — Maginot, Moore & Beck LLP

(57) ABSTRACT

A microelectronic component includes a semiconductor substrate having a top side and a reverse side, an elastically movable mass device on the top side of the substrate, at least one source region provided in or on the mass device, at least one drain region provided in or on the mass device, and a gate region suspended on a conductor track arrangement above the at least one source region and at least one drain region and spaced apart from the mass device by a gap. The conductor track arrangement is anchored on the top side of the substrate in a periphery of the mass device such that the gate region remains fixed when the mass device has been moved.

21 Claims, 9 Drawing Sheets

US 9,082,882 B2

MICROELECTRONIC COMPONENT AND CORRESPONDING PRODUCTION PROCESS

This application claims priority under 35 U.S.C. §119 to patent application no. DE 10 2012 217 133.9, filed on Sep. 24, 2012 in Germany, the disclosure of which is incorporated herein by reference in its entirety.

BACKGROUND

The present disclosure relates to a microelectronic component and to a corresponding production process.

Micromechanical sensors, for example inertial sensors, are usually implemented by means of capacitive or piezoresistive transducers. In the literature, there have for some time been reports of what are called moving-gate inertial sensors, although no such sensors are available on the market to date. One reason for this is the way in which the transducer element is produced, more particularly the provision of a suitable sacrificial layer operation and the availability of CMOS layers with suitable, well-defined mechanical or thermomechanical properties.

Typically, the sacrificial layer used in micromechanics is silicon oxide. In the case of moving-gate inertial sensors, however, the channel region and the source/drain contacts would be open and unprotected, since the thin gate oxide is inevitably also removed when the sacrificial layer is removed. Thus, the channel region would then be open and unprotected, as would the pn junctions between source/drain region and channel region. The result is generation of surface states which disrupt the operating range of the field-effect transistor or lead to drift and noise, and make the sensor element unreliable.

EP 0 990 911 A1 describes a micromechanical field-effect-based sensor and the use thereof, wherein a gate region is movable with respect to the source and drain region.

US 2009/0317930 A1 describes a method for producing a structure having a mobile element by means of a heterogeneous sacrificial layer.

US 2011/0265574 A1 describes a system comprising micromechanical functional elements and CMOS devices.

DE 10 2009 029 217 A1 describes an inertial sensor comprising a field-effect transistor, wherein the gate electrode is fixed and the channel region is formed and arranged so as to be movable.

SUMMARY

The present disclosure provides a microelectronic component and a corresponding production process.

The production process according to the disclosure allows inexpensive production of an integrated micromechanical sensor. More particularly, an MEMS sensor element with well-defined layer properties can be produced. The production operation provides an essentially continuous silicon surface.

What is enabled is, more particularly, the production of a robust mechanical MEMS component, for example composed of monocrystalline silicon. It has only a low dependence, if any, on stress in the CMOS layers and exhibits defined temperature dependence. Expensive deposition or transfer bonding of thick MEMS layers is unnecessary. Thus, relatively thick functional layers with relatively high mass area density are achievable inexpensively. The peripheral continuous silicon surface is available to the switching operation.

The mass device or the inertial mass may have a relatively high mass density, since no sacrificial layer etching holes are needed for under-etching.

Preferred developments are the subject of the dependent claims.

The concept on which the present disclosure is based is that the MEMS component has a transistor as a transducer element, with channel, source and drain region of the transistor integrated in a movable mechanical functional unit in the form of the mass device, and with the gate region suspended on a conductor track arrangement, in such a way that the gate region remains fixed when the mass device has been moved.

The mechanical decoupling of the movable mechanical functional unit from its environment is achieved through respective gaps from the conductor track region and from the substrate beneath. Laterally, this gap is bridged only by a mechanically flexible connection and feed lines integrated therein.

The gap between the conductor track region and the movable mechanical functional unit is preferably bounded at the top and bottom by oxide layers. Such oxide layers serve simultaneously as an etching stop during the sacrificial layer etching, and as passivation for prevention of unwanted surface leakage currents.

The elastically movable mass device can be used, for example, for detection of inertial measurement parameters, for example acceleration and rotation rate.

In a preferred embodiment, the conductor track arrangement has a multitude of conductor track planes embedded into an insulation layer and connected vertically to one another through vias, and wherein the gate region is suspended at at least one of the conductor track planes. The mechanical rigid suspension of the gate region on the surrounding CMOS layers is achieved, for example, through metal elements in the uppermost conductor track plane. Such metal elements have to be under-etched in the sacrificial layer etching operations, which has to be taken into account in setting the dimensions thereof and the dimensions of the etching holes. A relatively large distance from the sacrificial layers is beneficial, in order that, even in the case of directional etching steps, under-etching through obliquely incident ions is possible without any need for isotropic post-etching. The metal plane or conductor track arrangement ensures, for example by means of a grid of holes, the rigid connection of the gate region with the surrounding CMOS layers and the electrical connection of the gate region, and additionally as an etching mask for oxide etching.

In a further preferred embodiment, electrical connection lines for the drain region and/or the source region are conducted with insulation within a first polysilicon layer above the mass device, wherein the drain region and/or source region are connected via respective contact bridges to the corresponding connection lines. Such electrical connection lines made from polysilicon enable lower leakage currents than corresponding diffusion lines in which the insulations are achieved via PN junctions. In addition, a plurality of transistors can be connected on the movable mechanical functional unit in the form of the mass device.

In a further preferred embodiment, the contact bridges are disposed in corresponding holes of the insulation layer. Thus, the contact bridges can follow the movement of the mass device.

In a further preferred embodiment, a central source region is provided, wherein a multitude of drain regions spaced apart therefrom is provided, such that differential actuation of the corresponding transistors can be obtained when the mass device has been moved. A differential evaluation of the sensor signal when two transistors are used envisages that the conductivity of one transistor rises, while the conductivity of a second transistor falls at the same time. The signal evaluation can favorably be converted, for example, by means of a Wheatstone bridge, high accuracy being achievable. The principle of differential measurement can be extended to several transistors, which allows the accuracy to be increased further.

In a further preferred embodiment, the mass device is connected to the periphery via a spring device integrated within the substrate. Preferably, the mechanically flexible connection of the mass device to the surrounding substrate is achieved through a monocrystalline spring made from substrate material. Such a suspension is well-defined in terms of its mechanical properties.

In a further preferred embodiment, the gate region has a central region from which a multitude of fingers proceed, each finger forming a gate of a corresponding transistor. In the case of a laterally symmetric transistor arrangement consisting of several transistors on the mass device, even better suppression of noise is possible. In this case, it is also possible to use a complete Wheatstone bridge.

In a further preferred embodiment, the fingers are arranged parallel to one another and are at a first distance, wherein corresponding parallel transistor channels are at a second distance different from the first distance. In the case of use of a different lateral period, it is possible to implement a vernier measurement principle, which enables particularly exact measurement of the relative position of the rigid gate relative to the movable mass direction. It is particularly favorable when the centers of the transistor channels and of the gate fingers coincide at rest.

In a further preferred embodiment, the gate region is formed in a second polysilicon layer and is electrically connected to the conductor track arrangement. The MEMS component may comprise, for example, two polysilicon planes and one metal plane. In this case, the lower polysilicon plane serves as an electrical feed line for the transistor connections, as an etching stop in the oxide lattice region and as a sacrificial layer to produce a gap in the gate region. In that case, the upper polysilicon layer serves as a gate electrode and as a sacrificial layer for production of the gap between the rigid gate region and the movable mechanical functional unit.

In a further preferred embodiment, a further insulation layer has been provided on the drain region and/or the source region and/or the channel region. This improves electrical insulation.

BRIEF DESCRIPTION OF THE DRAWINGS

The present disclosure is illustrated in detail hereinafter by the working examples adduced in the schematic figures of the drawings. These show.

DETAILED DESCRIPTION

Figure 1A:
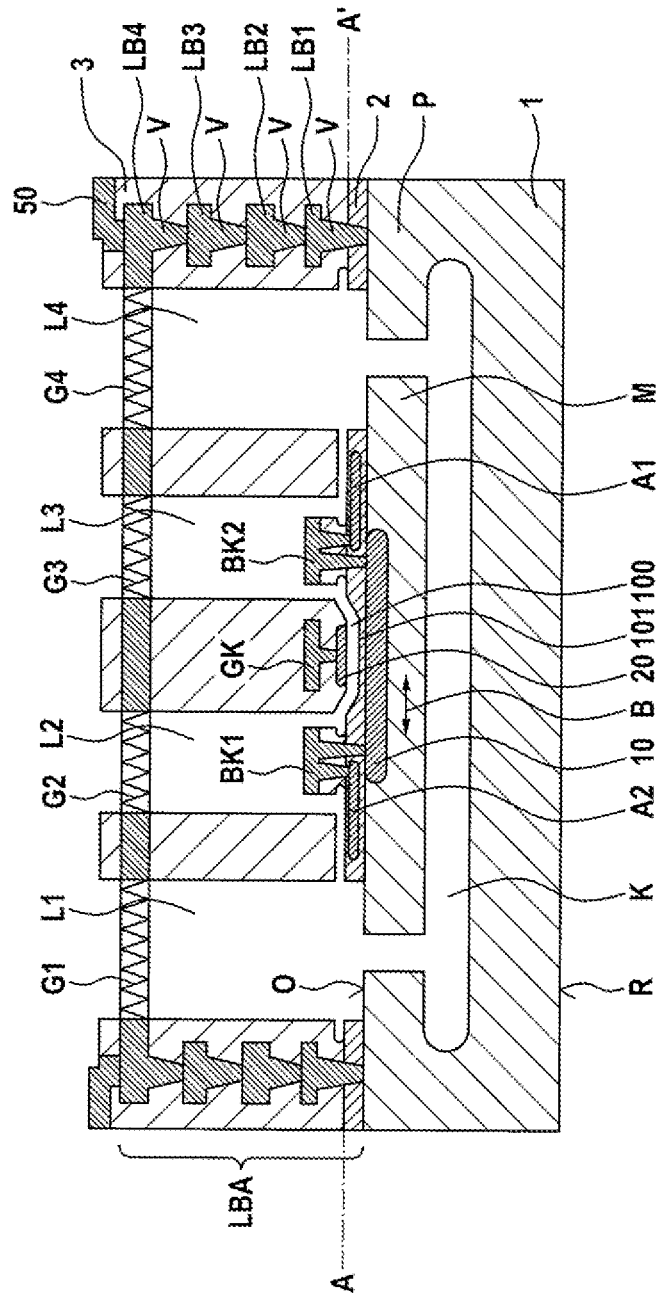
FIG. 1a),b) schematic section diagrams for illustration of a microelectronic component in a first embodiment of the present disclosure, FIG. 1a) in vertical cross section and FIG. 1b) in horizontal cross section along the line A-A' in FIG. 1a)

In the figures, identical reference numerals denote identical or equivalent elements.

Figure 1B:
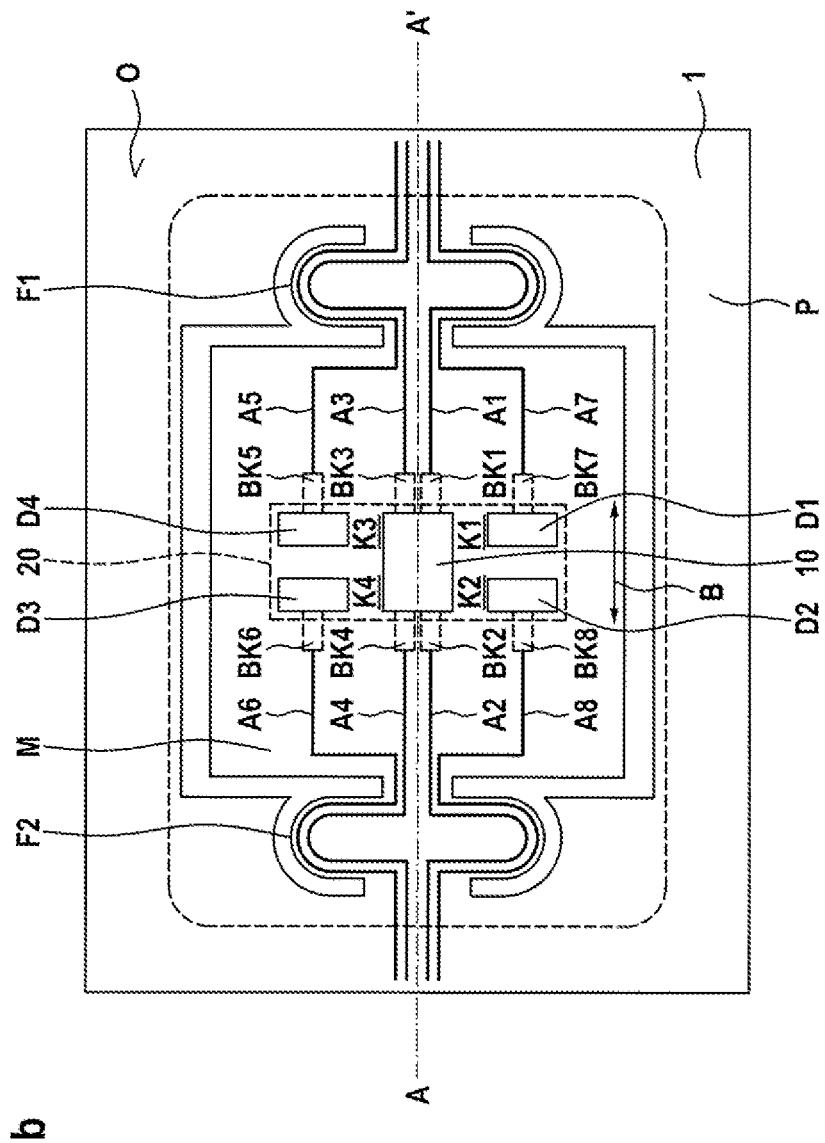

FIGS. 1a),b) are schematic sectional diagrams for illustration of a microelectronic component in a first embodiment of the present disclosure, FIG. 1a) in vertical cross section and FIG. 1b) in horizontal cross section along the line A-A' in FIG. 1a).

FIG. 1a),b) shows a micromechanical component which is an inertial sensor with a movable channel. Reference numeral 1 here denotes a monocrystalline silicon semiconductor substrate having a top side O and a reverse side R.

The silicon semiconductor substrate 1 has a cavern K above which is provided an elastically movable mass device M connected to a periphery P of the silicon semiconductor substrate 1 via a spring device F1, F2 consisting of a first silicon spring F1 and a second silicon spring F2 structured into the silicon semiconductor substrate 1. The elastically movable mass device M is thus movable in the direction of the arrow B, for example on the basis of occurrence of external accelerations.

Integrated into the mass device M in the central region thereof is a common source region 10 which has been formed, for example, through appropriate doping of the silicon semiconductor substrate 1. Provided on both sides of the common source region 10 are drain regions D1-D4, specifically drain regions D1, D2 on one side and drain regions D3, D4 on the other side, which are spaced apart by the common source region 10, with arrangement of corresponding channel regions K1-K4 in the respective connection line to the common drain region.

Above the common source region 10 and the drain regions D1-D4 is provided a gate region 20 suspended on a conductor track arrangement LBA, which is spaced apart from the mass device M by a gap 100.

The conductor track arrangement LBA has a multitude of conductor track planes LB1-LB4 embedded in an insulation layer 3 composed of oxide, which are connected vertically to one another through vias V. Through the uppermost conductor track plane LB4 and the insulation layer 3, the gate region 20 is anchored in a periphery P of the mass device M such that the gate region 20 remains fixed or rigid when the mass device M has been moved.

In the uppermost conductor track plane LB4 are provided etching grids G1-G4, below which are corresponding etching holes L1-L4 in the insulation layer 3. These etching grids G1-G4 and etching holes L1-L4 serve for production of the micromechanical component and are described in detail below with reference to FIGS. 2a-f.

Electrical connection lines A1-A8 are embedded into a further insulation layer 2 of oxide on the top side O of the silicon semiconductor substrate. The connection lines A1-A8 serve for electrical connection of the common source region 10 and of the drain regions D1-D4, and respective contact bridges BK1-BK8 consisting of vias V and segments of the first conductor track plane LB1 bring about a connection of the connection lines A1-A8 to the common source region 10 or the drain regions D1-D4. The contact bridges BK1, BK2 are shown in detail in FIG. 1a), whereas they are merely indicated by a respective broken line in FIG. 1b) for reasons of clarity.

The further insulation layer 2 of oxide, more particularly, covers the connection lines A1-A8, and also the common source region 10 and the drain regions D1-D4, such that no unwanted surface leakage currents can occur. More particularly, the further insulation layer 2 is tapered in the region of the gate region 20, which is designated with reference number 101.

Likewise implemented in the first conductor track plane LB1 is a gate contact GK electrically connected to the gate region 20 through a corresponding via.

As shown in FIG. 1b), the common gate region 20 at rest covers all the channels K1-K4 of the transistors in question in a symmetric manner, whereas, in the moved state of the mass device M, unsymmetric coverage occurs, which can be interpreted, for example, as a differential electrical signal.

The electrical contact bridges GK1-GK8 are provided in corresponding etching holes L2, L3 of the insulation layer 3, such that they do not cause disruption by acting as stops in the event of movement of the mass device M.

Finally, reference numeral 50 denotes a covering layer provided above the conductor track arrangement LBA on the insulation layer 3 and connected to the uppermost conductor track plane LB4.

In the periphery P is provided a circuit region (not shown) connected to the connection lines A1-A8 and the gate contact GK, such that the electrical signals can be evaluated in the periphery P.

Figure 2A:
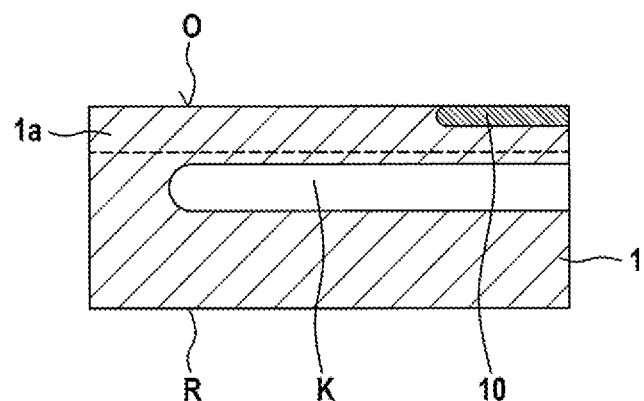
FIG. 2a)-f) schematic vertical cross-sectional diagrams for illustration of a process for producing the microelectronic component in the first embodiment of the present disclosure.

FIGS. 2a)-f) are schematic vertical cross-sectional diagrams for illustration of a process for producing the microelectronic component in the first embodiment of the present disclosure.

In FIG. 2a), a cavern K is first introduced into a silicon semiconductor substrate 1, for example by an APSM operation known from DE 103 58 859 A1. Subsequently, the silicon semiconductor substrate 1 is thickened by means of an epitaxial layer 1a indicated by a broken line in FIG. 2a). For reasons of simplification, the depiction of the epitaxial layer 1a is omitted hereinafter.

In a subsequent operating step, a doping operation is effected for production of the common source region 10 and of the drain regions D1-D8.

Figure 2B:
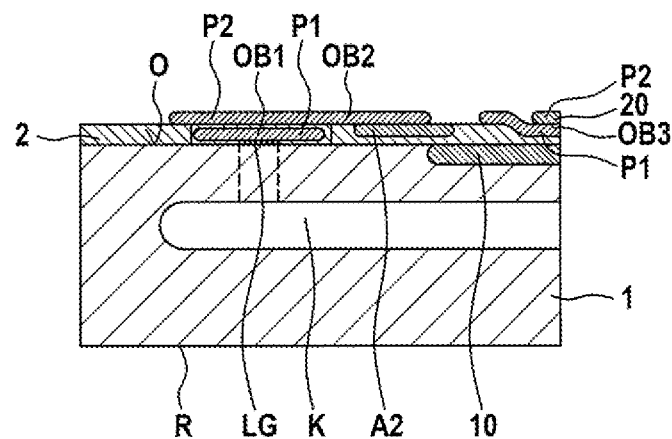

Still with reference to FIG. 2b), on a top side O of the silicon semiconductor substrate 1, at least one oxide layer 2 is provided, in which, above the region which runs around the springs F1, F2 or around the mass device M, a grid of holes LG is provided, which serves as a mask for later etching, as indicated by the broken line in FIG. 1b).

The grid of holes LG thus defines the movable mechanical structures in the silicon semiconductor substrate 1. Still with reference to FIG. 2b), a first polysilicon plane P1 and a second polysilicon plane P2 are provided in and on the insulation layer 2 composed of oxide. In this context, the regions OB1 and OB3 of the first polysilicon layer P1 are sacrificial layer regions, as is the region OB2 of the second polysilicon layer P2. The region A2 of the first polysilicon layer P1 forms the electrical connection line A2 for the common source region 10, whereas the region 20 of the second polysilicon layer P2 forms the gate region.

The sacrificial layer regions OB1, OB2, OB3 serve in later operating steps to facilitate mobility of the elastically movable mass device M or to form the gap 100 between the mass device M and the gate region 20 and the surrounding structures.

Figure 2C:
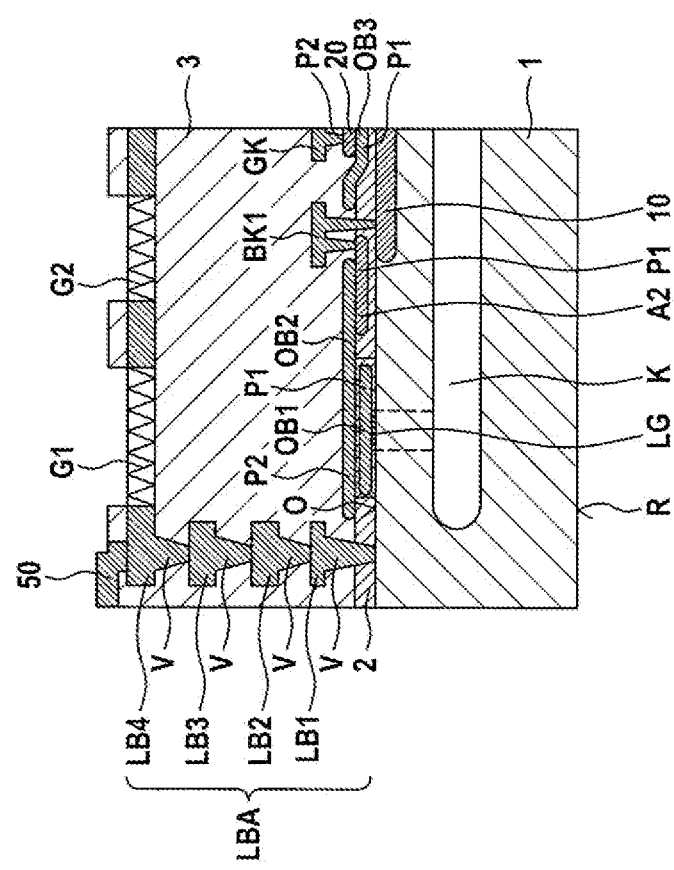

In the process steps which follow, which are illustrated in FIG. 2c), the conductor track arrangement LBA is formed by deposition and structuring of the conductor track planes LB1-LB4 with the vias V in between. More particularly, the bridge contacts BK1-BK8 and the gate contact GK are formed in the first conductor track plane LB1. The conductor track planes LB1-LB4 are embedded into an insulation layer 3 composed of oxide.

In the uppermost conductor track plane LB4, at the points where the etching holes L1-L4 are to be formed later in the insulation layer 3, corresponding etching grids G1-G4 are formed. This is done by means of a perforation operation known per se, using an appropriate mask which is not shown.

Figure 2D:
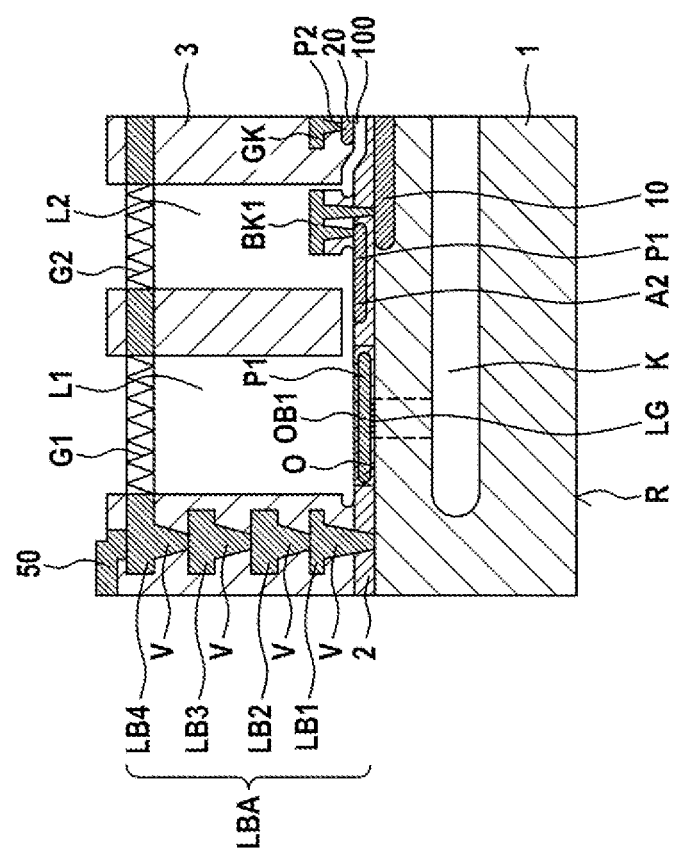

As shown in FIG. 2d), in a directional etching process, for example reactive ion etching, for the oxide of the insulation layer 3, the etching holes L1-L4 are then formed, these reaching as far as the second polysilicon plane P2 or as far as the first polysilicon plane P1. Optionally, an isotropic gas phase etching step for the oxide of the insulation layer 3 can be effected, in order to laterally under-etch the metal lattice elements of the conductor track arrangement LBA.

In a further operating step, which is likewise illustrated in FIG. 2d), sacrificial layer etching of the sacrificial layer regions OB2 and OB3 is then effected, for example using $XeF_2$ or $ClF_3$ or the like. This leads to the state as shown in FIG. 2d).

Figure 2E:
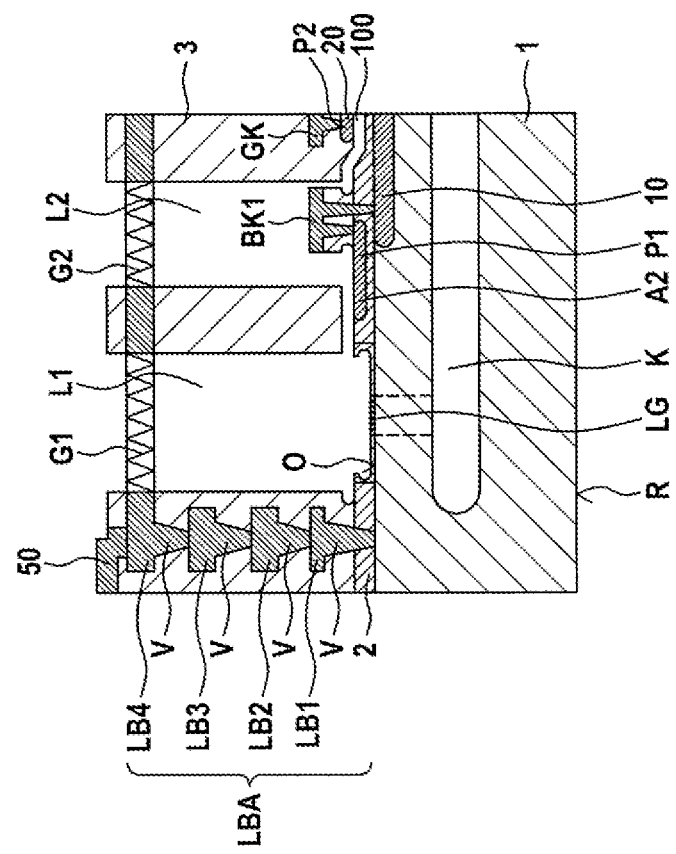

As shown in FIG. 2e), there is then a brief etching step for removal of the oxide on the sacrificial layer region OB1 above the grid of holes LG. This could possibly also be effected in a common etching step for oxide and polysilicon.

Figure 2F:
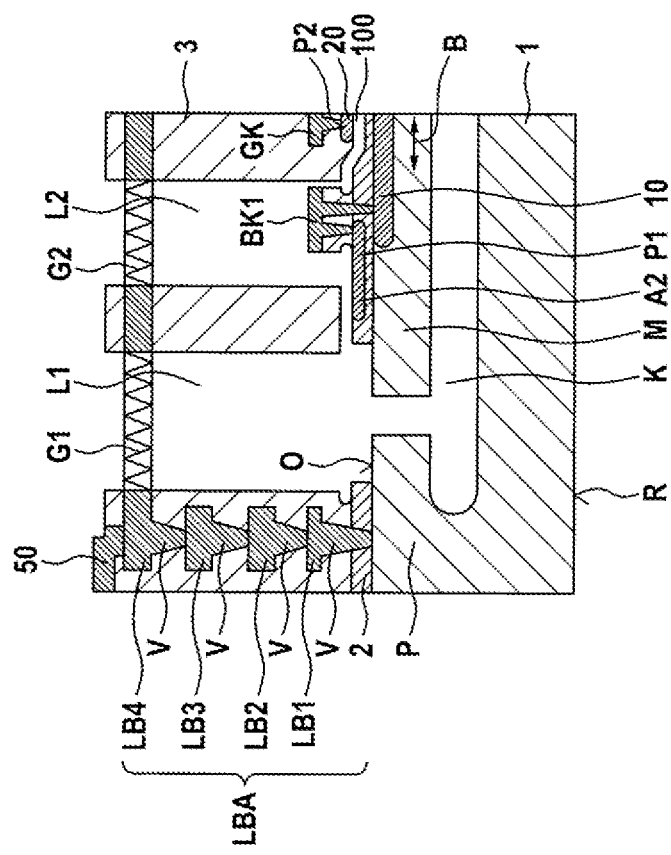

After removal of the sacrificial layer region OB1, the silicon of the silicon semiconductor substrate 1 is etched by a trench etching step at the regions defined by the grid of holes LG to facilitate movement of the corresponding springs F1, F2 and of the mass device M, as shown in FIG. 2f).

The grid of holes LG composed of oxide can be removed in the region below the etching holes L1 by directional oxide etching, for example by reactive ion etching for oxide, or by a brief isotropic gas phase etching step, in which case the oxide of the insulation layer 2 remains as a protective layer on the common source region 10 and the drain regions B1-B8.

Thus, the structure of the micromechanical component according to FIGS. 1a),b) is complete.

The steps known per se for production of the circuit arrangements disposed in the periphery P will not be elucidated here in detail, since they are known to the person of average skill in the art.

Figure 3:
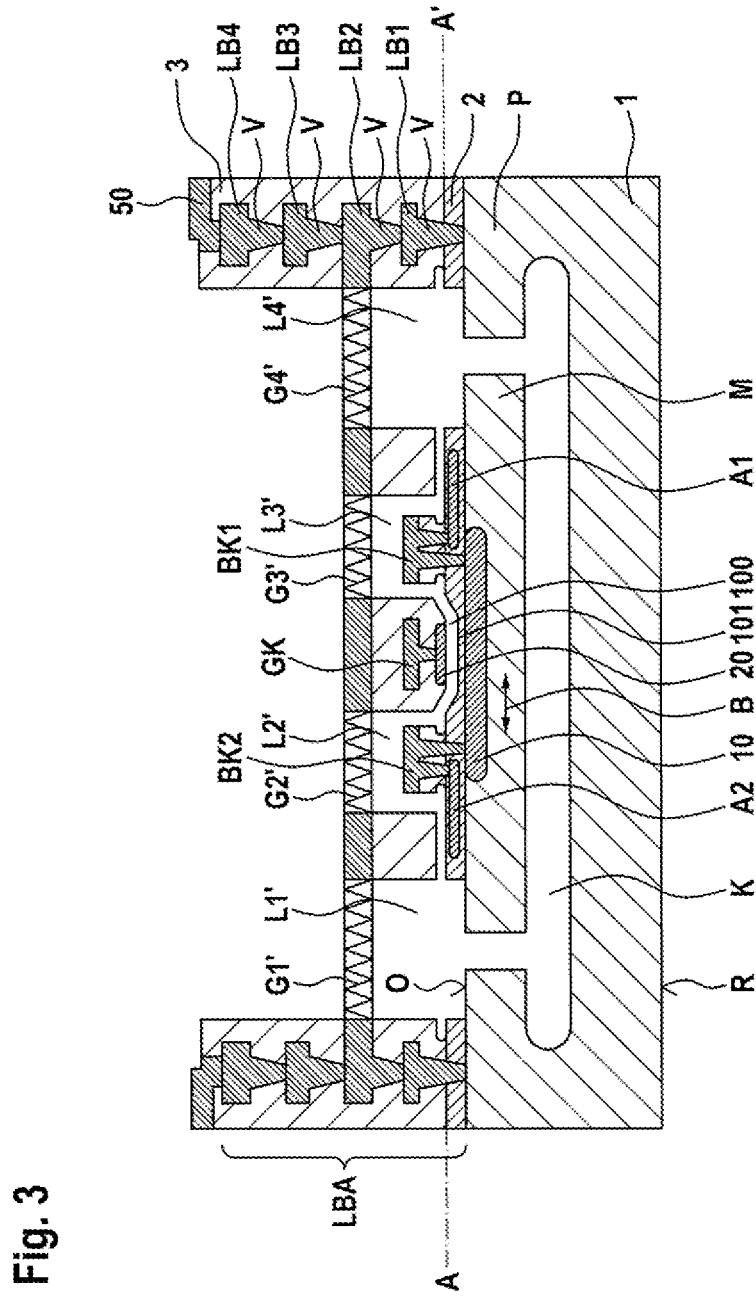
FIG. 3 a schematic vertical cross-sectional diagram for illustration of a microelectronic component in a second embodiment of the present disclosure.

FIG. 3 is a schematic vertical cross-sectional diagram for illustration of a microelectronic component in a second embodiment of the present disclosure.

In the second embodiment according to FIG. 3, the gate region 20 is suspended above the second conductor track plane LB2, and the latter has the etching grids G1'-G4' with the corresponding etching holes L1'-L4' beneath.

Otherwise, the second embodiment according to FIG. 3 is identical to the above-described first embodiment according to FIG. 1a),b).

Figure 4:
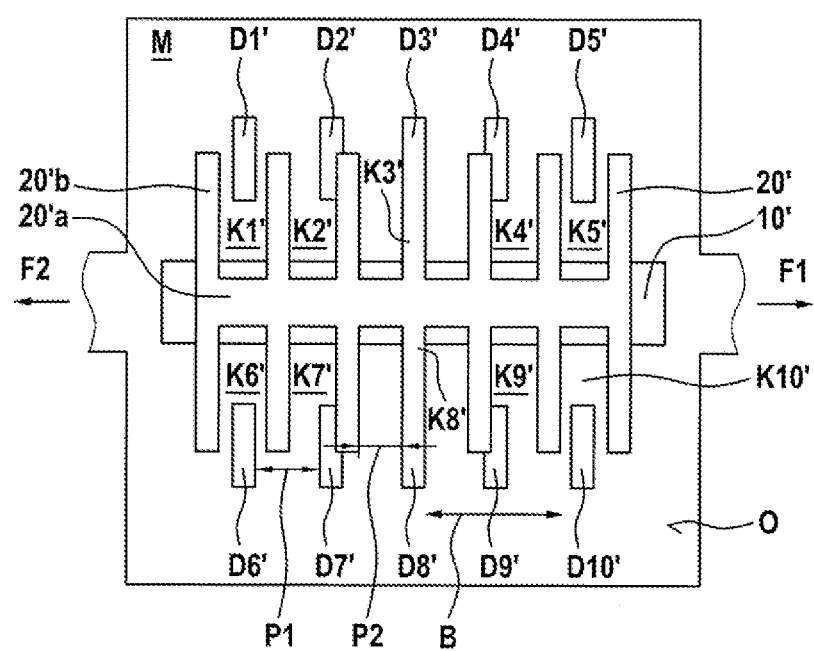
FIG. 4 a detail of a schematic horizontal cross-sectional diagram for illustration of a microelectronic component in a third embodiment of the present disclosure.

FIG. 4 is a detail of a schematic horizontal cross-sectional diagram for illustration of a microelectronic component in a third embodiment of the present disclosure.

In the third embodiment according to FIG. 4, the gate region 20' has a double-sided comb structure, with provision of a central region 20a' from which a respective multitude of parallel fingers 20b' proceeds on both sides, each finger 20'b forming a gate of a corresponding transistor.

The corresponding transistors are formed by a common source region 10' and, with parallel spacing on either side, drain regions D1'-D5' and D6'-D10' with channel regions K1'-K5' and K6'-K10' in between.

In this third embodiment, the parallel drain regions D1'-D5' and D6'-D10' have a first lateral period or a first lateral distance P1, and the corresponding parallel transistor channels K1'-K5' and K6'-K10' have a second lateral period or a second distance P2 different from the first distance P1. In this way, it is possible to implement a vernier measurement principle which enables particularly exact measurement of the relative position of the rigid gate region 20' with respect to the movable mass unit M. It is favorable in this context when the centers of the transistor channels K1'-K5' and K6'-K10' and of the gate fingers 20'b on the respective side of the central region 20'a coincide at rest.

Although the present disclosure has been described fully above with reference to preferred working examples, it is not restricted thereto, but is modifiable in various ways.

More particularly, the materials specified are specified merely by way of example and not as a restriction. It is also possible to select, for example, the number, arrangement and form of the source/drain and gate regions as desired.

What is claimed is:

1. A microelectronic component comprising:
a semiconductor substrate including a top side and a reverse side;
an elastically movable mass device on the top side of the substrate;
at least one source region located in or on the mass device;
at least one drain region located in or on the mass device; and
at least one gate region suspended on a conductor track arrangement above the at least one source region and the at least one drain region and spaced apart from the mass device by a gap,
wherein the conductor track arrangement is anchored on the top side of the substrate in a periphery of the mass device, such that the at least one gate region remains fixed when the mass device has been moved; and
wherein the mass device is connected to the periphery via a spring device integrated within the substrate.

2. The micromechanical component according to claim 1, wherein:
the conductor track arrangement includes a plurality of conductor track planes embedded into an insulation layer and connected vertically to one another through vias, and
the at least one gate region is suspended at at least one of the conductor track planes of the plurality of conductor track planes.

3. The micromechanical component according to claim 2, further comprising:
a plurality of electrical connection lines for at least one of (i) the at least one drain region, and (ii) the at least one source region, the electrical connection lines of the plurality of electrical connection lines are conducted with insulation within a first polysilicon layer above the mass device, and
at least one of (i) the at least one drain region, and (ii) the at least one source region are connected via respective contact bridges of a plurality of contact bridges to corresponding electrical connection lines of the plurality of electrical connection lines.

4. The micromechanical component according to claim 3, wherein the contact bridges of the plurality of contact bridges are disposed in corresponding holes of the insulation layer.

5. The micromechanical component according to claim 1, further comprising:
a central source region, wherein a plurality of drain regions of the at least one drain region is spaced apart from the central source region, such that differential actuation of corresponding transistors are obtainable when the mass device has been moved.

6. The micromechanical component according to claim 5, wherein:

the at least one gate region includes a central region from which a plurality of fingers proceed, and
each finger of the plurality of fingers is configured to form a gate of a corresponding transistor.

7. The micromechanical component according to claim 6, wherein:
the fingers of the plurality of fingers run in parallel and define a first distance from one another, and
corresponding parallel transistor channels define a second distance different from the first distance.

8. The micromechanical component according to claim 2, wherein the at least one gate region is formed in a second polysilicon layer and is electrically connected to the conductor track arrangement.

9. The micromechanical component according to claim 1, further comprising:
a further insulation layer located on at least one of (i) the at least one drain region, (ii) the at least one source region, and (iii) a channel region.

10. A process for producing a microelectronic component, comprising:
providing a semiconductor substrate including a top side and a reverse side;
forming an elastically movable mass device on the top side of the substrate by:
forming a cavern in the substrate; then
depositing an epitaxial layer on the top side; and then
forming at least one source region and at least one drain region located in or on the mass device by doping the at least one source region and the at least one drain region into the top side;
forming a gate region suspended on a conductor track arrangement above the at least one source region and the at least one drain region and spaced apart from the mass device by a gap; and
anchoring the conductor track arrangement on the top side of the substrate in a periphery of the mass device, such that the gate region remains fixed when the mass device has been moved.

11. The process according to claim 10, further comprising:
depositing sacrificial layers in regions which are to be made movable; and
forming an etching grid after formation of the conductor track arrangement in an uppermost conductor track plane, the etching grid being configured to form holes in the conductor track arrangement,
wherein the sacrificial layers are at least partly removed through the holes, in order to make the regions movable.

12. The process according to claim 11, wherein:
after the removal of the sacrificial layers, the substrate is etched through the holes in order to form a spring device, and
the spring device is configured to make the mass device elastically movable.

13. A microelectronic component comprising:
a semiconductor substrate including a top side and a reverse side;
an elastically movable mass device on the top side of the substrate;
at least one source region located in or on the mass device;
at least one drain region located in or on the mass device;
a further insulation layer located on at least one of (i) the at least one drain region, (ii) the at least one source region, and (iii) a channel region; and at least one gate region suspended on a conductor track arrangement above the at least one source region and the at least one drain region and spaced apart from the mass device by a gap, wherein the conductor track arrangement is anchored on the top side of the substrate in a periphery of the mass device, such that the at least one gate region remains fixed when the mass device has been moved.

14. The micromechanical component according to claim 13, wherein:

the conductor track arrangement includes a plurality of conductor track planes embedded into an insulation layer and connected vertically to one another through vias, and the at least one gate region is suspended at at least one of the conductor track planes of the plurality of conductor track planes.

15. The micromechanical component according to claim 14, further comprising:

a plurality of electrical connection lines for at least one of (i) the at least one drain region, and (ii) the at least one source region, the electrical connection lines of the plurality of electrical connection lines are conducted with insulation within a first polysilicon layer above the mass device, and at least one of (i) the at least one drain region, and (ii) the at least one source region are connected via respective contact bridges of a plurality of contact bridges to corresponding electrical connection lines of the plurality of electrical connection lines.

16. The micromechanical component according to claim 15, wherein the contact bridges of the plurality of contact bridges are disposed in corresponding holes of the insulation layer.

17. The micromechanical component according to claim 13, further comprising:

a central source region, wherein a plurality of drain regions of the at least one drain region is spaced apart from the central source region, such that differential actuation of corresponding transistors are obtainable when the mass device has been moved.

18. The micromechanical component according to claim 13, wherein the mass device is connected to the periphery via a spring device integrated within the substrate.

19. The micromechanical component according to claim 13, wherein:

the at least one gate region includes a central region from which a plurality of fingers proceed, and each finger of the plurality of fingers is configured to form a gate of a corresponding transistor.

20. The micromechanical component according to claim 19, wherein:

the fingers of the plurality of fingers run in parallel and define a first distance from one another, and corresponding parallel transistor channels define a second distance different from the first distance.

21. The micromechanical component according to claim 14, wherein the at least one gate region is formed in a second polysilicon layer and is electrically connected to the conductor track arrangement.

* * * * *